United States Patent
Woo

(10) Patent No.: US 7,910,268 B2
(45) Date of Patent: Mar. 22, 2011

(54) METHOD FOR FABRICATING FINE PATTERN IN PHOTOMASK

(75) Inventor: Sung Ha Woo, Suwon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 143 days.

(21) Appl. No.: 12/345,872

(22) Filed: Dec. 30, 2008

(65) Prior Publication Data

US 2009/0263731 A1   Oct. 22, 2009

(30) Foreign Application Priority Data

Apr. 22, 2008   (KR) .................. 10-2008-0037406

(51) Int. Cl.
   *G03F 1/00*   (2006.01)
(52) U.S. Cl. ........................................... 430/5; 430/322
(58) Field of Classification Search .............. 430/5, 311, 430/322; 716/19
   See application file for complete search history.

(56) References Cited

U.S. PATENT DOCUMENTS

| 5,302,477 A | * | 4/1994 | Dao et al. ................... 430/5 |
| 5,932,378 A | * | 8/1999 | Lee ............................... 430/5 |
| 6,686,102 B2 | | 2/2004 | Randall et al. |
| 6,686,300 B2 | | 2/2004 | Mehrotra et al. |

FOREIGN PATENT DOCUMENTS

KR   10-2001-0004612   1/2001

* cited by examiner

*Primary Examiner* — Stephen Rosasco
*Assistant Examiner* — Stewart A Fraser
(74) *Attorney, Agent, or Firm* — Marshall, Gerstein & Borun LLP

(57) ABSTRACT

A method for fabricating a fine pattern in a photomask includes forming a light shielding layer over a substrate; forming a first resist layer pattern over the light shielding layer to expose the light shielding layer with a first critical dimension; forming a groove by etching the portion of the light shielding layer exposed by the first resist layer pattern to a first depth; exposing an upper surface of the light shielding layer by removing the first resist layer pattern; forming a second resist layer pattern over the exposed upper surface of the light shielding layer so that a bottom of the groove is partially exposed; and forming a light shielding layer pattern by etching the portion of the light shielding layer exposed by the second resist layer pattern to a second depth so that the substrate is exposed with a second critical dimension which is smaller than the first critical dimension.

7 Claims, 4 Drawing Sheets

METHOD FOR FABRICATING FINE PATTERN IN PHOTOMASK

CROSS-REFERENCE TO RELATED APPLICATION

Priority to Korean patent application number 10-2008-0037406 filed on Apr. 22, 2008, the entire disclosure of which is incorporated herein by reference, is claimed.

BACKGROUND OF THE INVENTION

The invention relates generally to lithography technology and, more particularly, to a method for fabricating a fine pattern in a photomask.

In a process of fabricating a semiconductor device, a photomask formed with a pattern is used to realize the desired pattern on a wafer. Since the pattern realized on the photomask is transferred onto the wafer through the photolithography process, the process of fabricating the photomask is very important.

In order to fabricate the photomask, a light shielding layer and a resist layer are formed on a transparent substrate and an exposure process is performed on the resist layer using an electron beam. A development process is then performed on the exposed resist layer to form a resist layer pattern that selectively exposes the light shielding layer, and the exposed portion of the light shielding layer is etched using the resist layer pattern as an etching mask to form a light shielding layer pattern. After that, the resist layer pattern is removed. As the degree of integration of semiconductor devices increases and the sizes of the patterns formed on the wafer decreases, the size of the pattern formed on the photomask also decreases. For example, in a case of a semiconductor device of 50 nm, the size of the pattern formed on the photomask must be 200 nm in consideration of 1:4 reduction exposure. However, in the case of an exposure process using an electron beam exposure apparatus, there is a limit resolution due to properties of the electron beam exposure apparatus or the resist.

With current mass production processes, it is impossible to fabricate a mask pattern of 200 nm or less which is required for fabricating the wafer pattern of 50 nm or less on the wafer and it is also difficult to fabricate the pattern below the limit resolution in the electron beam exposure process. Therefore, studies have been made for fabricating a fine pattern below the limit resolution in the electron beam exposure process.

SUMMARY OF THE INVENTION

In one embodiment, a method for fabricating a fine pattern in a photomask comprises forming a light shielding layer over a substrate; forming a first resist layer pattern over the light shielding layer to expose a portion of the light shielding layer with a first critical dimension; forming a groove by etching the portion of the light shielding layer exposed by the first resist layer pattern to a first depth; exposing an upper surface of the light shielding layer by removing the first resist layer pattern; forming a second resist layer pattern over the exposed light shielding layer so that a bottom of the groove is partially exposed; and forming a light shielding layer pattern by etching the portion of the light shielding layer exposed by the second resist layer pattern to a second depth so that the substrate is exposed with a second critical dimension which is smaller than the first critical dimension.

DESCRIPTION OF SPECIFIC EMBODIMENTS

Hereinafter, a method for fabricating a pattern in a photomask according to the invention will be described in detail with reference to the accompanying drawings.

Figure 1:
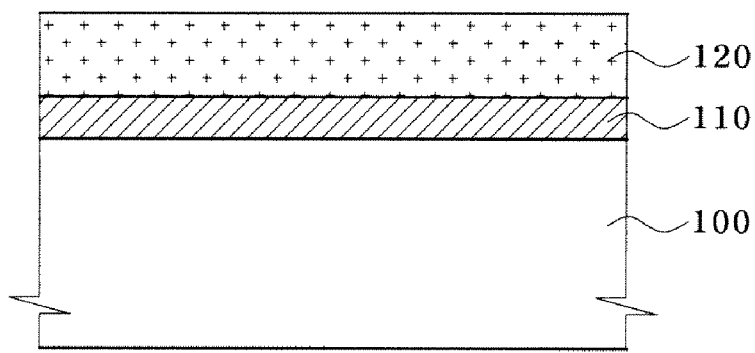
FIGS. 1 to 8 illustrate a process of fabricating a pattern in a photomask according to an embodiment of the invention.

Referring to FIG. 1, a light shielding layer 110 and a first resist layer 120 are formed over a transparent substrate 100, such as quartz, for example. Herein, the transparent substrate 100 includes a light shielding region in which a light shielding layer pattern is subsequently formed to shield the transmitted light and a light transmitting region which transmits the light. The light shielding layer 110 is preferably formed including a material capable of shielding the transmitted light, e.g. a chrome (Cr) layer. In an embodiment of the invention, a binary mask is employed as an example but a phase shift mask may also be employed if necessary or desired. In a case of the phase shift mask, a phase shift layer, for example, a molybdenum silicon oxynitride (MoSiON) layer which can shift the phase of light is preferably formed in an interface defined between the transparent substrate 100 and the light shielding layer 110.

Figure 2:
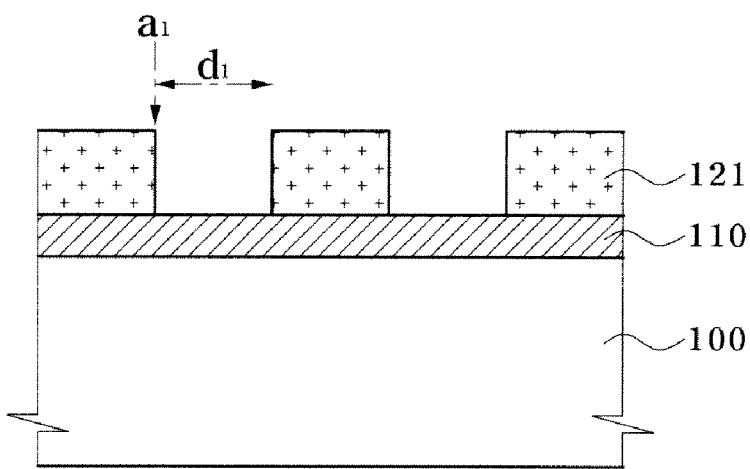

Referring to FIG. 2, an electron beam lithography process is performed on the first resist layer (120 in FIG. 1) to form a first resist layer pattern 121 so that the light shielding layer 110 is exposed with a first critical dimension (CD) $d_1$.

Specifically, the electron beam exposure process is performed on the first resist layer to selectively irradiate the electron beam on the basis of a first point $a_1$, and a development process using a developing solution is then performed on the exposed first resist layer. Then, utilizing a solubility difference between the portion irradiated by the electron beam and the portion not irradiated by the electron beam, the first resist layer is selectively removed and the first resist layer pattern 121 that selectively exposes the light shielding layer is formed. At this time, the first resist layer pattern 121 is formed so that the light shielding layer 110 is exposed with the first critical dimension (CD) $d_1$.

Figure 3:
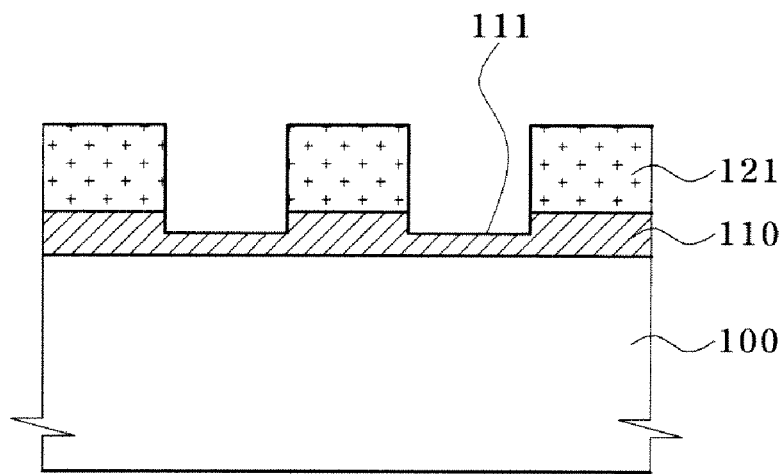

Referring to FIG. 3, the exposed portion of the light shielding layer 110 is half etched to a first depth using the first resist layer pattern 121 as an etching mask to form grooves 111 within the light shielding layer 110. Then, an upper surface of the light shielding layer 110 protected by the first resist layer pattern 121 has a height difference from the bottom of the groove 111 formed within the light shielding layer 110.

Figure 4:
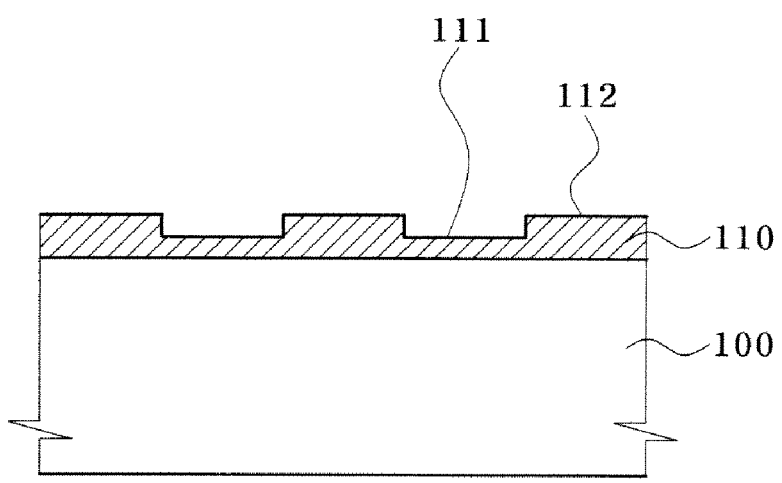

Referring to FIG. 4, a strip process is performed on the first resist layer pattern to remove the first resist layer pattern. Then, the light shielding layer 110 in which the grooves 111 and projection parts 112 projected by the grooves 111 are alternately formed is exposed. There is the height difference between the portion which has been protected by the first resist layer pattern 121 and the portion which has not been protected by the first resist layer pattern 121, e.g. between the projection part 112 and the groove 111.

Figure 5:
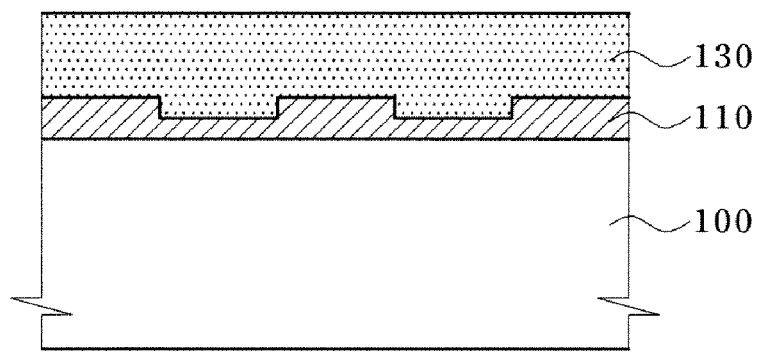

Referring to FIG. 5, a second resist layer 130 is formed over the light shielding layer 110 formed with the grooves 111. The second resist layer 130 is preferably formed of a material layer having identical properties to the first resist layer (120 in FIG. 1).

Figure 6:
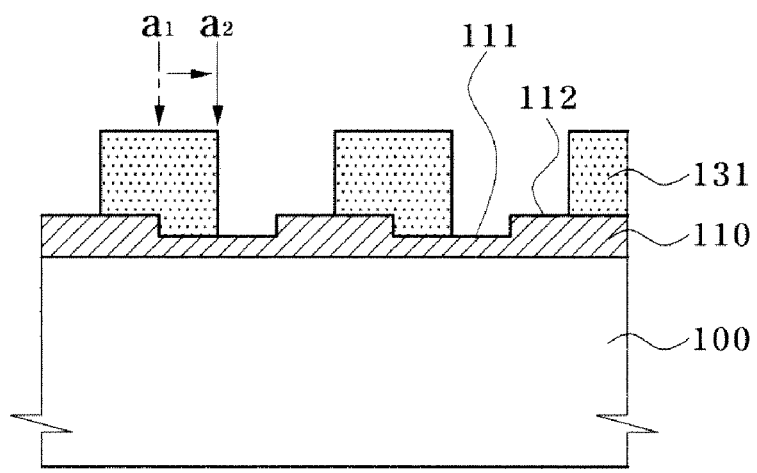

Referring to FIG. 6, an electron beam lithography process is performed on the second resist layer (130 in FIG. 5) to form a second resist layer pattern 131. At this time, the second resist layer pattern 131 is formed so that the second resist layer pattern 131 is placed at a position shifted by ½ of the first CD $d_1$ from the position where the first resist layer pattern 121 is formed and thus ½ of the bottom of the groove is exposed.

Specifically, the second resist layer pattern 131 is formed in such a manner that the electron beam is irradiated to the second resist layer on the basis of a second position $a_2$ which is spaced from the first position $a_1$, which is the reference position for the formation of the first resist layer pattern, by a distance smaller than the first CD $d_1$, and a development process using a developing solution is then performed on the exposed second resist layer. At this time, the second position $a_2$ is preferably set so that the second position $a_2$ is placed at a position spaced apart from the first positional by ½ of the first CD $d_1$ and thus ½ of the bottom of the groove 111 in the light shielding layer 110 is exposed. Also, the irradiation of the electron beam is performed by the same manner using substantially equal layout data except for the movement of the reference position as compared to the first resist layer pattern. Therefore, the first resist layer pattern 121 and the second resist layer pattern 131 have identical layouts.

Then, using a solubility difference between the portion irradiated by the electron beam and the portion not irradiated by the electron beam, the second resist layer is selectively removed and the second resist layer pattern 131 that partially exposes the bottom of the groove 111 within the light shielding layer 110 is formed. The second resist layer pattern 131 is preferably formed so that ½ of the bottom of the groove 111 within the light shielding layer 110 is exposed. The second resist layer pattern 131 is preferably and illustratively formed so that it has a layout identical to the first resist layer pattern 121 but is placed at the second position $a_2$ which is shifted by ½ of the first CD $d_1$ from the first position $a_1$.

Since the second resist layer pattern 131 is formed on the basis of the second position $a_2$ and the light shielding layer 110 formed with the grooves 111 is exposed with the CD $d_1$ equal to that of the first resist layer pattern 121, the bottom of the groove 111 is partially exposed and the upper surface of the projection part 112 is also partially exposed. In other words, the second resist layer pattern 131 is preferably formed so that the bottom of the groove 111 within the light shielding layer 110 is exposed by about ½ and the upper surface of the projection part 112 within the light shielding layer 110 is also exposed by about ½. Therefore, the step portion in the interface between the groove 111 and the projection part 112 within the light shielding layer 110 may be selectively exposed.

Figure 7:
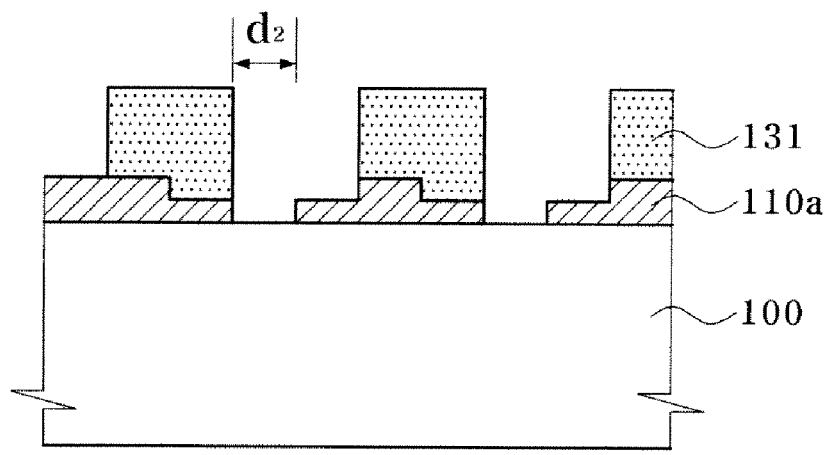

Referring to FIG. 7, the exposed portion of the light shielding layer 110 is etched to a second depth using the second resist layer pattern 131 as an etching mask to form light shielding layer pattern 110a that exposes the portion of the transparent substrate 100 by the second CD $d_2$. At this time, the step portion in the interface between the groove 111 and the projection part 112 is selectively exposed by the second resist layer pattern 131, the exposed step portion is also etched so as to have a step.

For example, while the portion of the light shielding layer 110 corresponding to the bottom of the groove 111 is etched by the second depth to expose the transparent substrate, the portion of the light shielding layer 110 corresponding to the upper surface of the projection part 112 is also etched by the second depth and remained on the transparent substrate 100. Therefore, when the portion of the light shielding layer 110 exposed by the second resist layer pattern 121 is etched, the light shielding layer pattern 110a that exposes the portion of the transparent substrate 100 with the second CD $d_2$. Consequently, the light shielding layer pattern 110a can be formed so that the portion of the transparent substrate 100 is exposed with a size below the limit resolution in the electron beam exposure process, for example, the second CD $d_2$.

Figure 8:
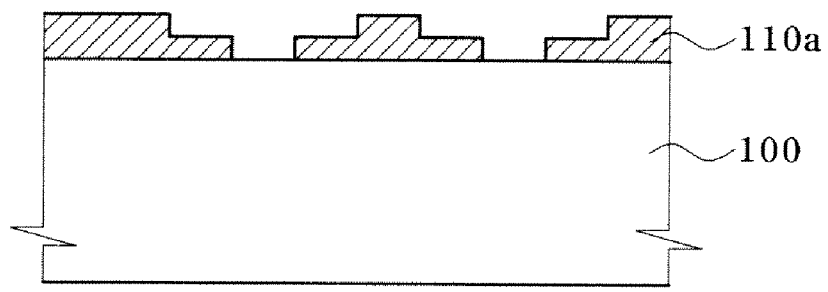

Referring to FIG. 8, a strip process is performed on the second resist layer pattern to remove the second resist layer pattern. Then, the light shielding layer pattern 110a alone is remained over the transparent substrate 100. Herein, the light shielding layer pattern 110a becomes the light shielding region that can shield the transmitted light in subsequent wafer process and the portion of the transparent substrate 100 exposed by the light shielding layer pattern 110a becomes the light transmitting region that transmits the light. Therefore, with current mass production process, it is possible to fabricate the mask pattern of 200 nm or less required for fabricating the wafer pattern of 50 nm or less over the wafer.

While the invention has been described with respect to the specific embodiments, various changes and modifications may be made without departing from the spirit and scope of the invention as defined in the following claims.

What is claimed is:

1. A method for fabricating a fine pattern in a photomask, comprising:
    forming a light shielding layer with a first thickness over a flat surface of a substrate;
    forming a first resist layer pattern over the light shielding layer to expose a portion of the light shielding layer with a first critical dimension;
    forming a groove by etching the portion of the light shielding layer exposed by the first resist layer pattern to a first depth, thereby forming a first light shielding layer having a first thickness and a second light shielding layer having a second thickness that is thinner than the first thickness;
    exposing an upper surface of the light shielding layer by removing the first resist layer pattern;
    forming a second resist layer pattern over the exposed light shielding layer to expose a half of the first light shielding layer and a half of the second light shielding layer; and
    forming a light shielding layer pattern by etching the exposed portion of the first and second light shielding layers, to remove the exposed second light shielding layer to expose the substrate with the exposed first light shielding layer remaining to cover the substrate.

2. The method of claim 1, wherein the light shielding layer comprises a chrome layer.

3. The method of claim 1, comprising forming the second resist layer pattern by moving a position of the second resist layer pattern from a position of the first resist layer pattern to partially expose the bottom of the groove.

4. The method of claim 3, comprising forming the second resist layer pattern so that ½ of the bottom of the groove is exposed.

5. The method of claim 1, comprising forming the second resist layer pattern to partially expose the bottom of the groove and the upper surface of the light shielding layer formed with the groove.

6. The method of claim 1, comprising forming the second resist layer pattern to expose ½ of the bottom of the groove and ½ of the exposed upper surface of the light shielding layer.

7. The method of claim 1, wherein the second resist layer has a layout identical to a layout of the first resist layer.

* * * * *